United States Patent [19]

Hooper et al.

[11] Patent Number: 4,742,014
[45] Date of Patent: May 3, 1988

[54] METHOD OF MAKING METAL CONTACTS AND INTERCONNECTIONS FOR VLSI DEVICES WITH COPPER AS A PRIMARY CONDUCTOR

[75] Inventors: Robert C. Hooper, Houston; Bobby A. Roane, Manvel; Douglas P. Verret, Sugar Land, all of Tex.

[73] Assignee: Texas Instruments Incorporated, Dallas, Tex.

[21] Appl. No.: 732,547

[22] Filed: May 10, 1985

[51] Int. Cl.$^4$ ............................................. H01L 21/28
[52] U.S. Cl. ..................................... 437/192; 437/198; 437/200; 437/203
[58] Field of Search ............ 29/589, 590, 591, 576 C, 29/577 R; 357/65, 71; 148/DIG. 20

[56] References Cited

U.S. PATENT DOCUMENTS

| 4,109,297 | 8/1978 | Lesh et al. | 357/71 |
| 4,367,119 | 7/1983 | Logan et al. | 29/580 |
| 4,541,169 | 9/1985 | Bartush | 29/591 |

FOREIGN PATENT DOCUMENTS 63069 5/1977 Japan ................................ 357/71 R

OTHER PUBLICATIONS

Moriya, "A Planar Metallization Process-Its Application to Trilevel Aluminum Interconnection," IEDM, pp. 550–553, 1983.
Broadbent, "Selective Low Pressure CuD of Tungsten", J. of Electrochem. Society, vol. 131, No. 6, Jun. 84, pp. 1427–1433.
Ghondi, VLSI Fabrication Principles, John Wiley and Sons, New York, 1983, pp. 437, 438 and 556–560.
Lloyd et al., "Metallurgical Scheme for an Electromigration Resistant, High Conductivity, Extrusion Resistant Conductor", IBM Tech. Discl. Bulletin, 26(1), 6/83.

Primary Examiner—Brian E. Hearn
Assistant Examiner—T. Thomas
Attorney, Agent, or Firm—James T. Comfort; Melvin Sharp; Leo Heiting

[57] ABSTRACT

Metal contacts and interconnections for integrated circuits utilize copper as the primary conductor, with the copper being totally encased in refractory metal layers on both top and bottom surfaces and also sidewalls. The contact hole in silicon oxide may be filled with a plug of refractory metal before the copper is deposited, or the first refractory metal layer may be conformally deposited to coat the sidewalls of the hole.

16 Claims, 1 Drawing Sheet

METHOD OF MAKING METAL CONTACTS AND INTERCONNECTIONS FOR VLSI DEVICES WITH COPPER AS A PRIMARY CONDUCTOR

BACKGROUND OF THE INVENTION

This invention relates to contacts and interconnects for semiconductor integrated circuit devices, and more particularly to methods of manufacture of VLSI devices employing improved metal contacts.

In the manufacture of integrated circuits, aluminum or aluminum alloys are most commonly used for contacts and interconnections, both for single level metallization and multilevel metallization. Aluminum and its alloys enjoy the advantages of lost cost, reasonably good conductivity, and good adherence to both silicon and silicon dioxide; also, deposition equipment and techniques, and chemical etchants, are readily available for deposition and selective removal.

However, as integrated circuit geometries shrink and complexity and bar size increase, aluminum-based integrated circuit metallurgy presents serious problems, further aggravated by multilevel metallization and the associated process complexity. Specifically, the problems include deformation at high temperature, thermal expansion mismatch, and electromigration.

Aluminum, even when doped with copper or titanium, tends to grow hillocks when heated to temperatures of about 400° C. or more. These hillocks can be spires of two microns in height above a one micron film, resulting in unwanted etching where photoresist in either absent or severely thinned over a hillock. This causes open circuits, and can also cause interlevel shorts in multilevel metal devices because a growing hillock can fracture an interlevel insulator (such as silicon oxide) above it if the insulator is thin.

The linear coefficient of expansion of aluminum is not a good match to silicon and is a factor of 50 greater than silicon dioxide. ($Al=25\times10^{-6}$/°C., $SiO_2=0.5\times10^{-6}$/°C. and $Si=4\times10^{-6}$/°C.). The expansion mismatch can also fracture an overlying insulator, but more importantly, the expansion of aluminum plays a major role in the failure of large integrated circuits during temperature cycle testing, where the failure mechanism is shorting adjacent leads due to shear forces at the corners of large bars. The source of the stress is apparently the mold compound used for plastic encapsulation.

Another problem with aluminum or aluminum alloys is electromigration failures, which are inadvertent open leads caused by high current density. High current can occur by design or by accidental reduction in the cross sectional area of the lead. Inadequate step coverage or notched or voided leads are examples of how this reduction can occur. Aluminum is one of the metals least resistant to electromigration due to the relatively low melting point.

Also aluminum is corroded by trace amounts of chloride ions. Copper-doped aluminum is even more susceptible to corrosion, so if this alloy is used to increase electromigration resistance, the device becomes more corrosion prone. Plasma etching or reactive ion etching of aluminum, or aluminum alloyed with copper or titanium, requires gaseous chlorine; if the residual chloride contamination is not absolutely controlled, corrosion will occur.

Another problem inherent with aluminum, and more so with copper doped aluminum, is that in multilevel metal technology, the resistivity of the metal dictates the metal thickness for a given design. And with three or more levels of metal the thicknesses are additive. This results in topography of the integrated circuits with peak to valley height differentials of several microns. Any subsequent photoresist processes then are most difficult, because the depth of field for focused exposure radiation is quite different at different topographical heights. Usually, photoresist is overexposed at peaks and underexposed in valleys, resulting in loss of line width control and tendency to electromigration failures. Use of a more conductive material and thinner metallization is desirable to reduce this effect.

Particularly in manufacture of bipolar integrated circuitry using Shottky technology, aluminum reacts with the platinum silicide of Schottky diodes and causes undesirable changes in the electrical characteristics if temperatures of 400° C. are reached. Since 450° C. is a common sinter/anneal temperature in device processing, a barrier layer is interposed, typically Ti:W, to prevent diode and contact degradation. The diffusivity of aluminum through this barrier layer dictates a thickness, which adds to the thickness of the composite metal film and complicates multilevel processing.

It is therefore the principal object of this invention to provide improved metallization for contacts and interconnections in high-density integrated circuits. Other objects are to reduce the failures in metallization of integrated circuits due to deformation in higher temperature processing, due to thermal expansion differences, due to electromigration, due to corrosion, due to step coverage, and/or reaction with other materials.

SUMMARY OF THE INVENTION

In accordance with one embodiment of the invention, metal contacts and interconnections for integrated circuits utilize copper as the primary conductor, with the copper being totally encased in refractory metal layers on both top and bottom surfaces and also sidewalls. The contact hole in silicon oxide may be filled with a plug of refractory metal before the copper is deposited, or the first refractory metal layer may be conformally deposited to coat the sidewalls of the hole.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENTS

Figure 1:
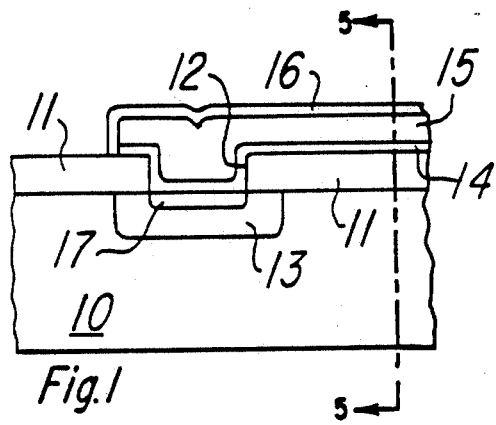
FIG. 1 is an elevation view in section of a contact to a semiconductor device, according to one embodiment of the invention.

Referring to FIG. 1, a metal contact and interconnect structure for an integrated circuit is illustrated according to the invention. A silicon body 10, part of a silicon bar containing a memory device or microprocessor, for example, has a silicon dioxide coating 11 on one face with a hole 12 in the coating for a contact to a region 13 of the face. The region 13 may be of the same type as the body, or opposite type, depending upon the device being constructed. A metal contact and interconnect structure includes a first layer 14 of molybdenum or other refractory metal such as tungsten, applied by a method such as sputtering so it will provide at least some step coverage, i.e., coating the sidewalls of the hole 13. A layer 15 of copper overlies the layer 14, and this layer is applied by plating, using photoresist as a mask as will be described; the copper has a very high conductivity and so the thickness need be much less than typically used for aluminum to achieve the same resistance. An upper layer 16 of tungsten is applied to the copper by a selective deposition method, so the copper plating layer 15 is totally encased in the refractory metal layer 16. It is noted that the interface between the refractory metal layer 12 and the silicon region 13 may include a silicide-clad area 17, such as platinum silicide or titanium silicide, depending upon the type of device being constructed, i.e., bipolar, MOS, CMOS, etc., and also may include a Schottky barrier.

Figure 2:
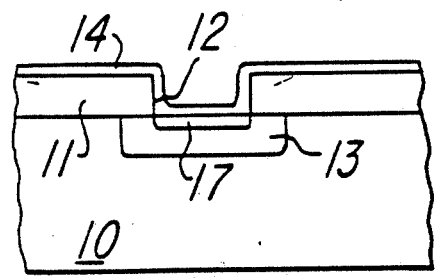
FIGS. 2 and 3 are elevation views in section of the device of FIG. 1 at successive stages in manufacture.
Figure 3:
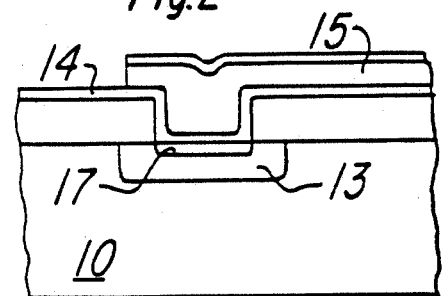
Figure 4:
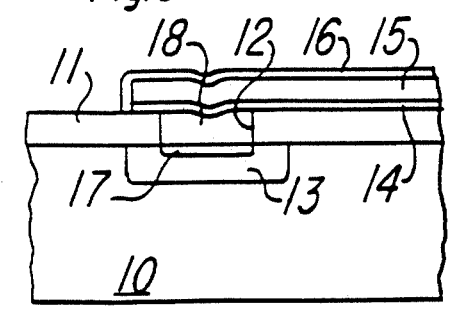
FIG. 4 is an elevation view in section of a contact to a semiconductor device, according to another embodiment of the invention.

Referring to FIGS. 2-4, a method of making the device of FIG. 1 will be described. The silicon body 10 has the silicon dioxide layer 11 formed on it by deposition (or thermal oxidation). The structure at this point may already have other layers, not illustrated, such as polysilicon for transistor gates or interconnects and the like. The hole 12 in the oxide is created by a standard photolithographic process, using either anisotropic etching such as RIE leaving vertical sidewalls, or wet etching which will leave sloping sidewalls. If the oxide layer 11 is a doped multilevel oxide as in MOS processing, there may be a heat treatment for reflow, but this is not necessary. The silicide cladding 17 (if used) is formed at this time by direct reacting, using the oxide 11 as a mask.

The molybdenum layer 14 is created by sputtering to a thickness of about 1000 Å; molybdenum is chosen because it has good conductivity ($6 \times 10^{-6}$ ohm-cm), good adherence to silicon dioxide, very high electromigration resistance (melting point is 2625° C.), and it can be selectively removed by plasma etching using fluorine chemistry ($C \times F_y + O_2$). Tungsten has these same qualities except that it is more difficult to sputter a film with good conductivity. The sputtered molybdenum coating 14 covers the entire face of the slice; it is not patterned until after the copper has been patterned.

As seen in FIG. 3, the copper layer 15 is applied to cover the entire face by sputtering, for example, and then is patterned using photoresist to leave the contact and lead area shown. Using the copper (and its overlying photoresist) as a mask, the molybdenum layer 14 is patterned. A preferred method of applying the copper layer 15, however, is to first apply a photoresist with the reverse image of the desired copper pattern, then plating the copper layer 15 by electroless or electroplating methods using the photoresist as a mask. After stripping the photoresist and cleaning the copper pattern to remove any alkali ion contamination, the underlying molybdenum 14 is plasma etched to define the conductor pattern; this method is preferred due to the conformal coating of plating rather than the step coverage thinning that results from sputtering the copper.

Referring to FIG. 1, the next step is to place the slice in a reactor for CVD selective tungsten deposition of about 1000 to 2000 Å to provide the layer 16. Equipment and processes are commercially available that will deposit tungsten onto a conductor such as the copper layer 15, but not on insulators such as silicon oxide. The copper is thus totally encased. Although CVD deposition of the tungsten is preferable, obviously any method of encasing the copper with a barrier layer having a high melting point relative to aluminum is acceptable.

In another embodiment of the invention, as illustrated in FIG. 4, the hole 12 is filled with a selectively-deposited tungsten plug 18 before the molybdenum layer 14 is applied. The remainder of the process is the same. The advantage of this embodiment is the flat surface provided for subsequent layers.

Figure 5:
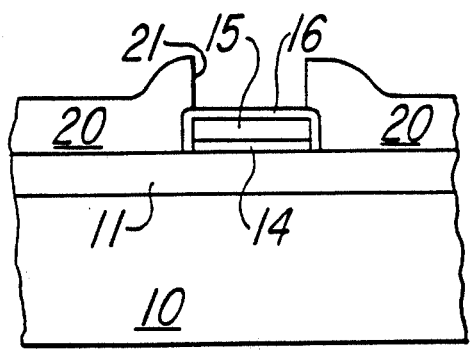
FIGS. 5 and 6 are elevation views in section of another embodiment where a second level of metallization makes contact to the metallization level of FIG. 1 or 4.

To make a contact to the conductor structure of FIG. 1 from another overlying metal layer, an insulator coating 20 is applied as seen in the sectional view of FIG. 5. A vertical-walled hole 21 in the insulator layer, or "via", is formed by photoresist masking and plasma etching. Note that the width of the hole 21 can be the same as the width of the copper conductor 15; that is, it is not necessary to "nest" the vias, i.e., make the contact area larger at this point to accommodate the via. This is because the etch rate of the silicon oxide insulator 20 can be selected to be the same as that for tthe tungsten layer 16, so when the etch reaches the metal it does not stop on metal and continue on silicon oxide to produce a depressed well surrounding the metal which would produce severe coverage problems for the subsequent metal layer. Over-etch of the oxide 20 is needed to assure removal over the metal, but this over-etch removes part of the tungsten so no undercutting results. Some or all of the tungsten can be removed above the copper in the via 21.

Figure 6:
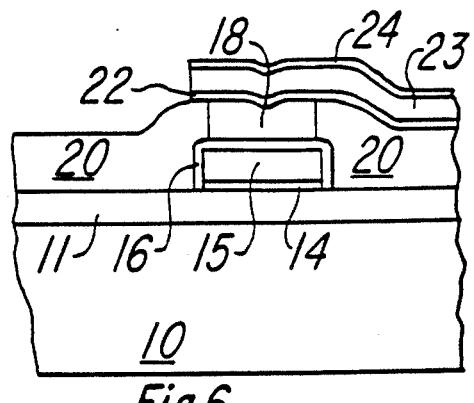

The upper level metallization as seen in FIG. 6 can be molybdenum 22, copper 23 and tungsten 24 formed just as in FIGS. 1-3. Also, a tungsten plug 18 can be added to improve planarity as in FIG. 4.

The advantages of the above-described metallization system as a first-level interconnect in integrated circuit manufacture are many. First, the leads are 34% more conductive than a Ti:W plus aluminum-copper alloy metal system of identical cross-sectional area, so lead resistance will be 34% less, or lead thickness can be reduced to minimize topographical height for multilevel designs. Since copper, molybdenum and tungsten are high melting materials (1083° C., 2625° C., and 3410° C., respectively, compared to aluminum at 660° C.), there will be no hillocks to depress yield of multilevel metallizations. Since the solid solubility of copper in silicon is $9 \times 10$ exp ($-5$) atomic % at 800° C., compared to aluminum in silicon 0.48% at 450° C., there is no danger of metallurgical interaction between copper and silicon, even if the copper penetrated the molybdenum barrier, "spiking" an underlying PN junction as can happen with aluminum-silicon. Whatever the susceptibility of PtSi Schottky diodes to changes in electrical characteristics due to molybdenum or copper PtSi reaction, the molybdenum thickness can be adjusted to prevent any problems that might arise from copper in this regard. (Since the activation energy for the formation of platinum silicide is 1.6 ev and for MoSi is 3.2 ev, molybdenum will not react with PtSi at all.)

Since the Cu copper layer 15 is completely encased by refractory metal there will be no corrosion problem such as occurs with aluminum-copper (1.8 volt galvanic couple) or tungsten-gold (2.5 volt galvanic couple). Also, since there is neither aluminum nor chlorine involved in the process so far, there will be no corrosion from that combination.

Another advantageous feature of this system is in step coverage. If there are topographical steps to be traversed, a thin film of molybdenum is the only sputtered part of the composite film and since plated copper films and also CVD tungsten films are conformal, there will be little or no step coverage problem. This allows elimination of a provision for lead thinning at steps, which in turn improves the performance and reliability of the integrated circuits.

Figure 7:
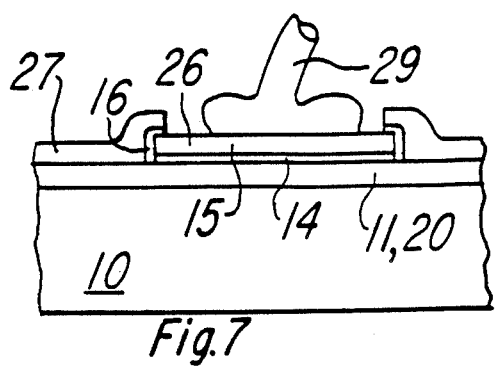
FIG. 7 is an elevation view in section of a bonding pad using the metallization of the invention.

Referring to FIG. 7, another advantage of the invention is in making thermocompression bonds at the bonding pads. A soft metal must be used at the bonding pad so that the gold wire and pad may be mechanically deformed to create the bond. Aluminum is usually employed, but causes formation of gold-aluminum intermetallics. Also, it would be undesirable to introduce another metal system or metallization layer. A metallizaton pad 26 is made of the same metal arrangement of FIG. 1 or 4-6, i.e., first or second level metal. The protective overcoat 27, which is oxide or nitride, is applied and patterned using photoresist, exposing the pad 26. Using the remaining oxide 27 as a mask, an etch removes the clad tungsten 16, so the softer copper 15 is exposed. But copper oxidizes, which is undesirable where the bond by the gold wire 29 is to engage the copper 15. Thus, a thin gold film is formed at this point, using immersion plating (electroless). This plates only in the holes, so no photoresist or etch operations are needed. Then, the ball bonds are made. Thus, soft metal is provided for the bonding operation, without additional process complexity.

In another embodiment, gold or other platable and relatively soft metal is substituted for the copper layer 15 in the embodiments of FIGS. 1-7. Copper has the advantage of higher conductivity and lower cost, compared to gold.

When this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a semiconductor device comprising the steps of:

applying a coating of an insulator material on a face of a semiconductor body, forming in said coating a contact or a via hole, depositing a first conducting barrier layer on said face whereby theسidewalls of said hole are coated, forming a copper strip over said first conductor, selectively depositing by chemical vapor deposition a second conducting barrier layer on said face to cover only said copper strip on the top and sidewalls of the copper strip, thereby encasing the copper strip.

2. A method according to claim 1 wherein said semiconductor body is silicon, said insulator coating includes silicon oxide, and said first and second conducting barrier layers are refractory metal.

3. A method according to claim 1 wherein said second conducting barrier layer is tungsten.

4. A method according to claim 2 wherein said first conducting barrier layer is molybdenum.

5. A method according to claim 1 including the step of substantially filling said contact hole by selectively depositing by chemical vapor deposition a plug barrier metal layer before depositing said first conducting barrier layer.

6. A method according to claim 1 wherein the step of forming the copper strip is by selective plating.

7. A method according to claim 1 wherein said step of depositing the conducting barrier layer is by sputtering.

8. A method according to claim 1 wherein said step of forming a copper strip is by selective plating.

9. A method according to claim 8 wherein said contact hole is selectively filled with conductor material before depositing said first barrier layer.

10. A method according to claim 9 wherein said conductor material filling said contact hole is tungsten.

11. A method of forming a conductor strip along the face of a semiconductor body, comprising the steps of:

applying a first coating on said face composed of a first barrier metal, forming a copper strip along said face over said first coating, selectively conformally coating by chemical vapor deposition a second barrier metal onto the top and sidewalls of said copper strip so as to coat only the copper strip and completely encase the copper in said first and said second barrier metal.

12. A method according to claim 11, wherein said second barrier metal is tungsten.

13. A method according to claim 12, wherein said first barrier metal is molybdenum or tungsten.

14. A method according to claim 13, wherein said refractory metal is applied by sputtering.

15. A method according to claim 12 wherein said first coating is patterned by etching after said copper strip has been formed.

16. A method according to claim 15 wherein said first barrier metal is molybdenum.

* * * * *